United States Patent [19]
Goronkin et al.

[11] Patent Number: 4,987,463
[45] Date of Patent: Jan. 22, 1991

[54] FET HAVING A HIGH TRAP CONCENTRATION INTERFACE LAYER

[75] Inventors: Herbert Goronkin; Saied N. Tehrani, both of Scottsdale, Ariz.

[73] Assignee: Motorola, Inc., Schaumburg, Ill.

[21] Appl. No.: 399,099

[22] Filed: Aug. 28, 1989

[51] Int. Cl.$^5$ ............................................. H01L 29/80
[52] U.S. Cl. ...................................... 357/022; 357/15; 357/16; 357/63
[58] Field of Search .................. 357/22 L, 22 I, 22 A, 357/22 K, 22 J, 15, 16, 63, 22 MD, 22 S

[56] References Cited

U.S. PATENT DOCUMENTS

| | | | |
|---|---|---|---|
| 4,688,062 | 8/1987 | Liles | 357/22 K |
| 4,745,448 | 5/1988 | Van Rees et al. | 357/22 A |

OTHER PUBLICATIONS

Horio et al., "Numerical Simulation of GaAs MESFET's on the Semi-Insulating Substrate Compensated by Deep Traps", IEEE Transactions on Electron Devices, vol. 35, No. 11, Nov. 88, 1778-1785.

Paulson et al., "The Effects of Implanted Oxygen on the Backgating Characteristics of GaAs IC's".

Smith et al., "Sidegating Reduction for GaAs Integrated Circuits by Using a New Buffer Layer".

Mishra et al., "Impact of Buffer Layer Design on the Performance of AlInAs-GaInAs HEMTs," IEEE 47th Annual Device Research Conference, Jun. 19-21, '89, Cambridge, MA, p. IVB-3.

Melloch et al., "Effect of a GaAs Buffer Layer Grown at Low Substrate Temperatures on a High-Electron-Mobility Modulation-Doped Two-Dimensional Electron Gas," Appl. Phys. Lett., 54 (10), Mar. 6, 1989, pp. 943-945.

Smith et al., "New MBE Buffer Used to Eliminate Backgating in GaAs MESFETs," IEEE Electron Device Letters, vol. 9, No. 2, Feb. '88, pp. 77-80.

Primary Examiner—William Mintel
Attorney, Agent, or Firm—Harry A. Wolin

[57] ABSTRACT

A FET having a high trap concentration interface layer and method of fabrication includes a semi-insulating gallium arsenide substrate having a high trap concentration interface layer formed therein. An non-intentionally doped buffer layer, also comprised of gallium arsenide, is then formed on the interface layer and is followed by the formation of a doped aluminum gallium arsenide layer thereon. A source, a gate and a drain are then formed on the FET layers. The FET and method disclosed herein are especially applicable for low current (5-1000 microamp) operation of microwave low-noise FETs.

11 Claims, 1 Drawing Sheet

FET HAVING A HIGH TRAP CONCENTRATION INTERFACE LAYER

BACKGROUND OF THE INVENTION

This invention relates, in general, to semiconductor devices, and more particularly to a field effect transistor (FET) having a high trap concentration interface layer and a method of fabrication.

In electronic devices such as gallium arsenide FETs, it is highly desirable to maintain total current flow in the active channel of the device. A depletion layer commonly forms beneath the gate due to Schottky barrier characteristics. This depletion layer moves further into the active channel as bias on the gate is increased and reduces the amount of current between the drain and source while increasing the current in other regions of the device such as the substrate. It is extremely difficult to modulate the current outside of the active channel as it moves further away from the gate.

The current not in the active channel causes the device to become non-operational at voltages close to gate pinchoff. As is well known in the art, gate pinchoff is the total voltage required to completely deplete the active channel. If current is flowing out of the active channel and into other regions of the device, the current will be greater than zero at pinchoff. This will cause a drain on the power source even when the device is supposedly turned off. Additionally, the noise figure and gain of low current devices are seriously degraded because of the inefficient modulation of current in the substrate.

SUMMARY OF THE INVENTION

Accordingly, it is an object of the present invention to provide a FET having a high trap concentration interface layer that results in increased modulation of current between the source and drain.

Another object of this invention is to provide a FET having a high trap concentration interface layer having reduced current in the substrate.

It is an additional object of the present invention to provide a FET having a high trap concentration interface layer that allows the device to be operated at voltages close to gate pinchoff.

Yet a further object of the present invention is to provide a FET having a high trap concentration interface layer wherein the current is zero at gate pinchoff.

An even further object of the present invention is to provide a FET having a high trap concentration interface layer that results in increased current in the active channel at bias voltages close to the gate pinchoff voltage.

The foregoing and other objects and advantages are achieved in the present invention by one embodiment in which, as a part thereof, includes a semi-insulating substrate having a high trap concentration interface layer formed in the substrate. A non-intentionally doped buffer layer, also comprised of gallium arsenide, is formed on the high trap concentration interface layer and an aluminum gallium arsenide layer is formed on the buffer layer. A gate is then formed on the aluminum gallium arsenide layer while source and drain contacts are formed on gallium arsenide.

A more complete understanding of the present invention can be attained by considering the following detailed description in conjunction with the accompanying drawings.

DETAILED DESCRIPTION OF THE INVENTION

Figure 1:
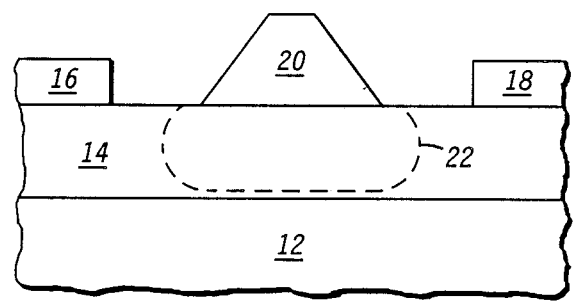
FIG. 1 is a highly enlarged cross-sectional view of a prior art MESFET.

FIG. 1 is a highly enlarged cross-sectional view of a prior art MESFET 10. MESFET 10 includes a substrate 12. One skilled in the art will understand that substrate 12 must be semi-insulating in this embodiment so that terminals on the same surface are isolated and MESFET 10 will not be shorted out by current flowing through substrate 12. Substrate 12 may be comprised of silicon or one of many III-V compound semiconductors although gallium arsenide is employed herein. A doped layer 14 is disposed on substrate 12. Doped layer 14 may also be comprised of many III-V compound semiconductors, although gallium arsenide is employed in this embodiment. Disposed on doped layer 14 is a source 16, a drain 18 and a Schottky gate 20. Source 16 and drain 18 may be comprised of many well known metals, however gold germanium nickel ohmic metal is employed in this embodiment. Additionally, gate 20 may be comprised of one of many well known metals such as tungsten or tungsten silicide, however titanium, platinum and gold layers (not individually shown) are employed in this embodiment.

The Schottky barrier characteristics of gate 20 cause a depletion layer 22 to form in doped layer 14 beneath gate 20. As the bias on gate 20 is increased, depletion layer 22 moves further into the active channel and reduces the current between drain 18 and source 16. The current is then forced into substrate 12 and becomes extremely difficult to modulate because of its distance from gate 20. This results in current in substrate 12 at or near pinchoff, which in turn creates a drain on the power source as well as degrading gain and noise figure.

Figure 2:
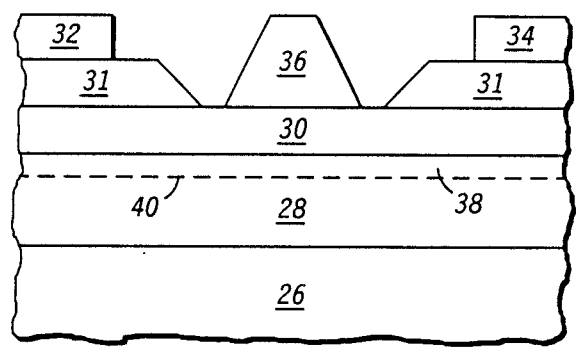
FIG. 2 is a highly enlarged cross-sectional view of a prior art heterostructure FET.

FIG. 2 is a highly enlarged cross-sectional view of a prior art heterostructure FET 24. FET 24 includes a substrate 26 that is semi-insulating in this embodiment. Again, substrate 26 may comprise silicon or a III-V compound semiconductor. The preferred material used herein is gallium arsenide. A non-intentionally doped buffer 28 is formed on substrate 26. Buffer 28 also comprises gallium arsenide in this embodiment. A doped layer 30 having an N+ conductivity type and comprised of aluminum gallium arsenide is disposed on buffer 28. A gate 36 is disposed on doped layer 30. Doped gallium arsenide contact layer 31 is also formed on doped layer 30 and source 32 and drain 34 are disposed thereon. Source 32, drain 34 and gate 36 are comprised of metals that are well known in the art.

As previously mentioned, it's highly desirable to restrict the current flow to the active channel 38 of FET 24. Active channel 38 includes the portion of buffer 28 disposed above dotted line 40. Conduction in the portion of buffer 28 below dotted line 40 and also in substrate 26 is dominated by space charged limited current in the presence of traps. Since the majority of microwave devices, such as FET 24, operate at higher currents (approximately 10 milliamps) and the buffer/substrate current is a very small portion of the total current between the source and drain, buffer 28 allows a higher current microwave device such as FET 24 to operate relatively efficiently. However, buffer 28 does not allow efficient operation of a low current (b 5–1000 microamps) microwave low noise FET.

Figure 3:
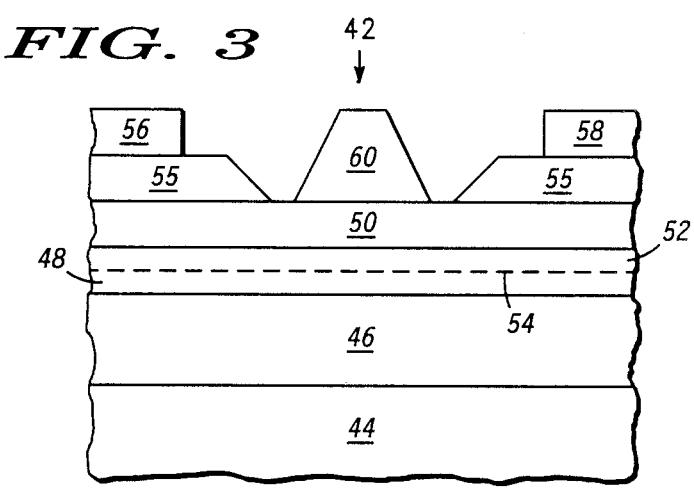
FIG. 3 is a highly enlarged cross-sectional view of a FET embodying the present invention.

FIG. 3 is a highly enlarged cross-sectional view of a FET 42 embodying the present invention. FET 42 includes a substrate 44 which, in this embodiment, is a semi-insulating substrate comprised of gallium arsenide. One skilled in the art will understand that substrates of other III–V compound semiconductors or of silicon may be employed. A high trap concentration interface layer 46 is formed in substrate 44. Interface layer 46 is differentiated from the remainder of substrate 44 by the implantation of oxygen therein. The implantation of oxygen may occur as either blanket or selective implantation. It should be understood that the implantation of oxygen into substrate 44 to form interface layer 46 will create a high trap concentration therein. It should also be understood that boron or another electrically inactive impurity capable of forming a high deep trap concentration layer may be employed in place of oxygen.

Following formation of interface layer 46, a nonintentionally doped buffer 48 is formed thereon. In this embodiment, buffer 48 is formed of the same material as substrate 44 (gallium arsenide). Buffer 48 is formed at a substrate temperature in the range of 560–620° C. The formation of buffer 48 also serves to anneal the oxygen implant. A doped layer 50 is then formed on buffer 48. It should be understood that although layer 50 is doped in this embodiment, it may be undoped or not uniformly doped in other embodiments. Doped layer 50 comprises aluminum gallium arsenide and has an N+ conductivity type in this embodiment. The active channel 52 of FET 42 includes a portion of buffer 48 above dotted line 54. FET 42 further includes a gate 60 formed on doped layer 50. Doped gallium arsenide contact layer 55 is also formed on doped layer 50 and source 56 and drain 58 are disposed thereon. Source 56, drain 58 and gate 60 are formed of well known metals by methods well known in the art.

FET 42 is extremely efficient as a low current (5–1000 microamps) microwave low noise FET. By trapping the fringing electrons in high trap concentration interface layer 46, the drain current is dominated by the current in above channel 52. Pushing the trap filling limited voltage to higher voltages and reducing the substrate current by increasing the trap concentration as disclosed above makes it possible for submicron gate FETs to operate at low currents.

Thus it is apparent that there has been provided, in accordance with the invention, a FET having a high trap concentration interface layer and method of fabrication which meet the objects and advantages set forth above. While specific embodiments of the invention have been shown and described, further modifications and improvements will occur to those skilled in the art.

It is desired that it be understood, therefore, that this invention is not limited to the particular forms shown and it is intended in the appended claims to cover all modifications which do not depart from the spirit and scope of this invention.

I claim:

1. A FET having a trap concentrated interface region comprising:
   a semi-insulating substrate;
   a trap concentrated interface region having an electrically inactive impurity therein, said region disposed in said substrate;
   a non-intentionally doped semiconductor buffer layer formed on said trap concentrated interface region of said substrate;
   a semiconductor layer formed on said buffer layer; and
   source, gate and drain contacts formed on the FET.

2. The FET of claim 1 wherein the semi-insulating substrate comprises one of the group consisting of a III–V compound semiconductor and silicon.

3. The FET of claim 2 wherein the trap concentrated interface region and the buffer layer comprises the same material.

4. The FET of claim 3 wherein the trap concentrated interface region and the buffer layer comprise gallium arsenide.

5. The FET of claim 2 wherein the trap concentrated interface region of the semi-insulating substrate is implanted with oxygen.

6. The FET of claim 5 wherein the implanted oxygen is in one of blanket and selective form.

7. The FET of claim 2 wherein the trap concentrated interface region of the semi-insulating substrate is implanted with boron.

8. The FET of claim 7 wherein the implanted boron is in one of blanket and selective form.

9. A FET having a trap concentrated interface region comprising:
   a semi-insulating gallium arsenide substrate;
   a trap concentrated interface region disposed in said substrate, said trap concentrated interface region being implanted with an electrically inactive impurity;
   a non-intentionally doped gallium arsenide buffer layer disposed on said trap concentrated interface region of said substrate;
   a doped aluminum gallium arsenide layer disposed on said buffer layer; and
   source, gate and drain contacts formed on the FET.

10. The FET of claim 9 wherein the trap concentrated interface region is implanted with one of the group consisting of oxygen and boron.

11. The FET of claim 9 wherein the trap concentrated interface region is implanted in one of blanket and selective form.

* * * * *